United States Patent
Chen

(12) 
(10) Patent No.: US 9,252,761 B2
(45) Date of Patent: Feb. 2, 2016

(54) VOLTAGE THRESHOLD CALIBRATION TECHNIQUES FOR LEVEL DETECTORS

(71) Applicant: Taiwan Semiconductor Manufacturing Co., Ltd., Hsin-Chu (TW)

(72) Inventor: Wei Chih Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 33 days.

(21) Appl. No.: 14/188,248

(22) Filed: Feb. 24, 2014

(65) Prior Publication Data

US 2014/0266315 A1    Sep. 18, 2014

Related U.S. Application Data

(60) Provisional application No. 61/781,208, filed on Mar. 14, 2013.

(51) Int. Cl.
*H03K 5/22* (2006.01)
*H03K 5/24* (2006.01)

(52) U.S. Cl.
CPC .................................. *H03K 5/2481* (2013.01)

(58) Field of Classification Search
CPC ... H03K 5/2481; H03K 5/249; H03K 5/2418; H04L 25/0272; H03F 3/45183
USPC ................................................ 327/65–67, 77
See application file for complete search history.

(56) References Cited

U.S. PATENT DOCUMENTS

| | | | | |
|---|---|---|---|---|
| 6,262,603 | B1 * | 7/2001 | Mohan et al. | 327/77 |
| 7,239,537 | B2 * | 7/2007 | DeBrosse et al. | 365/154 |
| 2012/0112794 | A1 * | 5/2012 | Chao et al. | 327/65 |
| 2013/0241599 | A1 * | 9/2013 | Soenen et al. | 327/65 |

* cited by examiner

*Primary Examiner* — Quan Tra
(74) *Attorney, Agent, or Firm* — Eschweiler & Associates, LLC

(57) ABSTRACT

Some embodiments relate to a level detector, comprising a current mirror including first and second current legs to carry first and second signals, respectively. The first current leg includes a first variable resistor and the second current leg includes a second variable resistor. During a calibration mode, a switching element provides a predetermined reference voltage across first and second control terminals of the first and second variable resistors, respectively. During a non-calibration mode, the switching element decouples the predetermined reference voltage from the first and second control terminals, and provides a signal across the first and second control terminals. Other embodiments are also disclosed.

20 Claims, 4 Drawing Sheets

VOLTAGE THRESHOLD CALIBRATION TECHNIQUES FOR LEVEL DETECTORS

BACKGROUND

Level detectors compare a voltage level of a signal with an unknown voltage level to a predetermined voltage threshold. An output signal, whose state is indicative of the relationship between the voltage level of the signal and the predetermined voltage threshold, is then provided. Level detectors are used in a variety of applications.

As one practical example of an application where a level detector can be useful, consider a Universal Serial Bus (USB) port for a laptop computer. When the USB port is empty, meaning that there is no USB device inserted into the USB port, the port can be characterized by a high-impedance or ground signal. In contrast, when a USB device (e.g., a memory stick, audio device, camera, etc.) is inserted into the USB port, the USB device delivers a predetermined voltage signature, such as a 100 mV pulse, to the USB port. To determine whether such a USB device has been inserted into the USB port, it would be ideal to use a voltage level detector with a predetermined voltage threshold of exactly 100 mV. In such a case, the level detector could compare the real-time voltage on the USB port (i.e., a signal) to the predetermined voltage threshold of 100 mV. If the voltage of the USB port is less than 100 mV, the level detector provides an output signal in a first state, which indicates no USB device is present. On the other hand, if the voltage on the USB port is equal to 100 mV, the level detector provides the output signal in a second state, which indicates a USB device is present. By evaluating the output state of the level detector, the laptop can determine whether a USB device has been inserted or not and take appropriate action. Numerous other applications are also possible for level detectors, such as wireless or wireline communication systems, automotive sensors, other bus protocols (e.g., Peripheral Component Interconnect (PCI)), among others.

Unfortunately, level detectors in some other approaches have been unable to provide precise voltage threshold comparisons.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
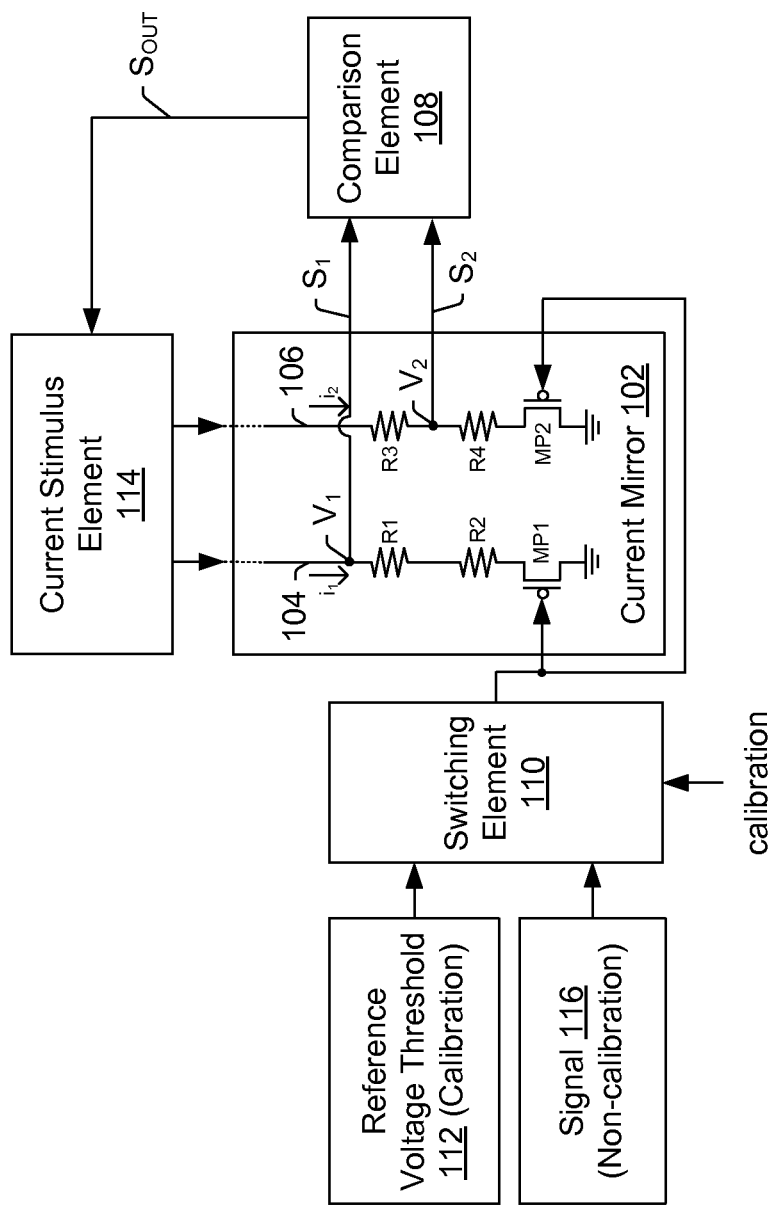
FIG. 1 shows some embodiments of a level detector circuit that makes use of improved calibration techniques.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 shows a level detector 100 in accordance with some embodiments of the present disclosure. The level detector 100 includes a current mirror 102 including first and second current legs 104, 106 through which first and second currents $i_1$, $i_2$, respectively, flow. First current leg 104 includes first and second resistors (R1, R2) in series with first transistor (MP1); while second current leg 106 includes third and fourth resistors (R3, R4) in series with second transistor (MP2). If currents $i_1$ and $i_2$ are equal, resistors R1 and R3 are matched, resistors R2 and R4 are matched, and source-follower transistors MP1 and MP2 are matched; then the first and second current mirror legs 104, 106 are "balanced." In such a case, when equal biases are applied to MP1 and MP2, the voltage levels of first and second signals $S_1$, $S_2$ have a natural voltage offset ($V_1-V_2=i_2*R_3$) there between. If process could be controlled for resistors R1-R4 and transistors MP1, MP2, the ratios of the resistances and/or transistor sizes could be designed to set this natural voltage offset to a predetermined voltage threshold, such as 100 mV for example. In this way, when the predetermined voltage threshold would be applied to the gates of transistors MP1, MP2, the induced voltage offset arising from the different resistances of MP1 and MP2 would cancel the natural voltage offset. In such a case, comparison element 108 would change the state of its output signal, $S_{out}$, at the predetermined voltage threshold without any calibration or fine tuning of the level detector 100.

To account for process variation between the resistors R1, R2, R3, R4 and transistors MP1, MP2, the present disclosure, in various embodiments, applies a reference voltage threshold to the gates of MP1 and MP2 during a calibration mode, wherein the reference voltage emulates a target voltage threshold. While the reference voltage threshold is applied, the current levels on the first and/or second current legs 104, 106 are "tuned" until the comparison element 108 flips its output state. Once suitable current levels are found during calibration, they are subsequently used during normal operation of the device to provide a determination of how a real-time signal relates to the target voltage threshold.

To start calibration, switching element 110 couples the reference voltage threshold 112 across the gate of MP1 and the gate of MP2, and the current stimulus element 114 sets currents $i_1$ and $i_2$ to predetermined initial current levels. For example, in the USB application, the reference voltage threshold 112 would be 100 mV, and can be realized by applying a voltage of 300 mV to the gate of MP1 and a voltage of 200 mV to the gate of MP2 to emulate a 100 mV voltage pulse occurring upon insertion of a USB device into USB port. For purposes of explanation, it is assumed that this initial condition results in $V_1$ being greater than $V_2$, such that comparison element 108 provides the output signal, $S_{out}$, in a first state (e.g., logical "0"). Upon recognizing that the output signal, $S_{out}$, is in the first state, current stimulus element 114 increases the current $i_2$ injected into the second current leg 106, which tends to increase $V_2$. The comparison element 108 again performs a comparison—and again assume that $V_1$ is still greater than $V_2$, such that the output signal, $S_{out}$, remains in the first state. Because the output signal, $S_{out}$, remains in the first state, the current stimulus element 114 again increases the current $i_2$ injected into the second leg 106. As current $i_2$ continues to be incrementally increased in this manner, at some point $V_2$ meets or exceeds $V_1$, at which point the comparison element 108 changes the state of the output signal $S_{out}$ (e.g., from a logical "0" to a logical "1"). Upon recognizing that the output signal is in the second state, the current stimulus element 114 stops increasing the current level for the second leg 106, and holds the current levels for the first and second legs at the present (calibrated) current values.

After calibration is complete, the calibrated current values remain stored in the current stimulus element 114, and switching element 110 decouples the reference voltage threshold 112 from the gates of transistors MP1, MP2 and couples the actual signal 116 to the gates of transistors MP1, MP2. In the USB example, the signal 116 can be the real-time voltage present on the USB port. During non-calibration, as long as the voltage level of the signal 116 is less than the target voltage threshold, the comparison element 108 outputs the first state. When the voltage level of the signal 116 reaches the target voltage threshold, the output signal, $S_{out}$, changes its output state. Thus, by analyzing the output signal, $S_{out}$, it is possible to determine whether the signal 116 has a voltage that equals the target voltage threshold. Therefore, for example, it can be determined whether a USB device has been inserted into a USB port in one example.

It will be appreciated that while an example has been discussed above wherein the current $i_2$ is iteratively ramped up so long as the output signal $S_{out}$ is in a first state, other schemes are within the contemplated scope of the present disclosure. For example, the current $i_2$ could be initially set to a high value and then be iteratively ramped down so long as the output signal $S_{out}$ is in the first state, and the calibrated current values could be stored as soon as the output signal transitions to the second state. Further, rather than solely $i_2$ being ramped up or down, $i_t$ could also be ramped up and/or down independent of $i_2$ or in coordinated fashion with $i_2$.

In addition, FIG. 1 illustrates an example where current mirror 102 includes MOS-type transistors MP1 and MP2. These MOS-type transistors MP1 and MP2 are just one example of variable resistors which have resistances that change depending on control voltages applied to the gates of the transistors. For example, when a low gate voltage (e.g., logical "0") is applied to the gate of a PMOS device, the device tends to exhibit a low resistance between its source and drain, whereas when a high gate voltage (e.g., logical "1") is applied to the gate of the PMOS device, the device tends to exhibit a high resistance between its source and drain. Other types of variable resistors could also be substituted in place of these MOS-type transistors.

Further still, it will be appreciated that although R1, R2, R3, and R4 are described and illustrated as "resistors", these "resistors" are just one example of a resistive component. For example, in some embodiments a resistive component can be a passive device, such as a long line of polysilicon arranged on an IC or a predetermined length of doped region in a semiconductor substrate either of which is fabricated to provide a predetermined resistance value. In other embodiments, a resistive component can manifest itself as an active device, such as a transistor having a control terminal tied to a predetermined voltage. For example, an active resistive component can be a PMOS device having its gate terminal tied to ground or an NMOS device having its gate terminal tied to VDD.

Figure 2:
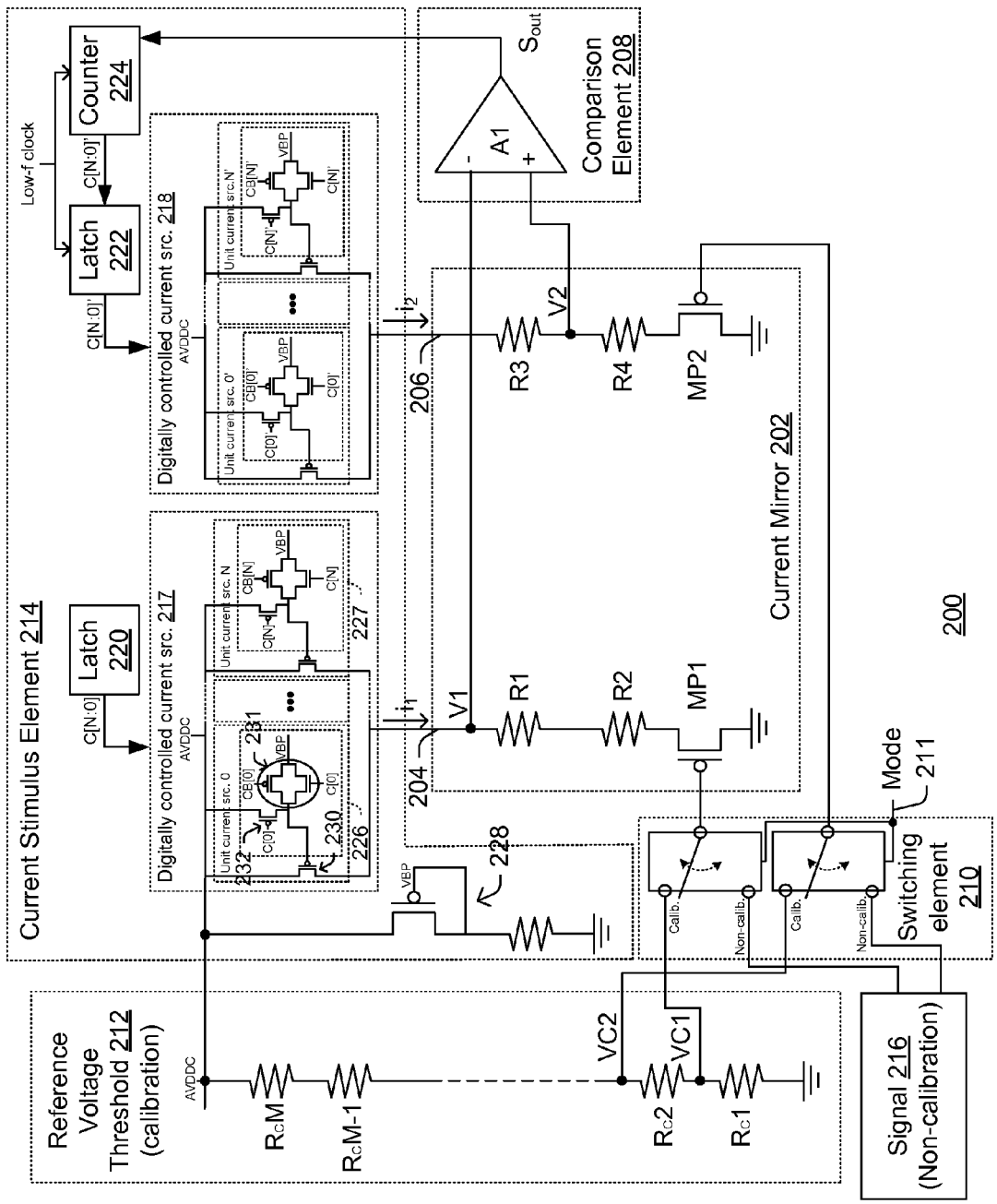
FIG. 2 shows some embodiments of a more detailed level detector circuit that makes use of improved calibration techniques.

FIG. 2 shows a more detailed example of some embodiments of a level detector 200. This level detector 200 has the same blocks as previously discussed with regards to FIG. 1's example, but also includes specific circuit structures which may or may not be present in FIG. 1's circuit. For example, FIG. 1 and FIG. 2 both include a current mirror (102, 202, respectively), first current leg (104, 204, respectively), second current leg (106, 206, respectively), comparison element (108, 208, respectively), switching element (110, 210, respectively), reference voltage threshold block (112, 212, respectively), current stimulus element (114, 214, respectively), and signal block (116, 216, respectively).

The level detector 200 includes current mirror 202 having first and second current legs 204, 206. First current leg 204 includes a first resistor R1, a second resistor R2, and a first PMOS transistor MP1 arranged in series; while second current leg 206 includes a third resistor R3, a fourth resistor R4, and a second PMOS transistor MP2 arranged in series. MP1 and MP2 act as source-followers. The level detector 200 also includes comparison element 208, switching element 210, reference voltage threshold 212, and current stimulus element 214. As with FIG. 1's embodiment, during a calibration mode, FIG. 2's level detector 200 applies the reference voltage threshold 212 to the gates of MP1 and MP2, and then, while the reference voltage threshold is applied, the current levels on the first and/or second current legs 204, 206 are "tuned" until the comparison element 208 flips its output state. The current levels at which the output state has flipped are stored and subsequently used during normal operation of the device to provide a determination of how a signal 216 relates to the target voltage threshold.

More particularly, switching element 210 can switch from first (calibration) positions to second (non-calibration) positions, based on a mode signal 211. When the switching element 210 is at the first positions (calibration), voltage VC1 is applied to the gate of MP1 and voltage VC2 is applied to the gate of MP2. The voltages VC1 and VC2 are set by the design implemented for reference voltage threshold 212. In some embodiments, the reference voltage threshold 212 includes M calibration resistors (M is any positive integer), which are arranged in series between a DC supply voltage (AVDDC) and ground. DC supply can be less than 1.0V in some embodiments, such as approximately 0.9V or 0.8V, for example. In an example where the M calibration resistors include 10 equally sized resistors and AVDCC=1.0V, VC1 can be 100 mV and VC2 can be 200 mV. This 100 mV difference between VC1 and VC2 can correspond to a 100 mV reference voltage threshold that emulates a target voltage threshold experienced when an actual USB device is inserted to a USB port during normal operation.

Applying 100 mV to the gate of MP1 and 200 mV to the gate of MP2 establishes voltage V1 on first current leg 204 and establishes voltage V2 on second current leg 206. Comparison element 208, which has a first input coupled to first current leg 204 and a second input coupled to second current leg 206, compares voltages V1 and V2. Based on this comparison, the comparison element 208 provides an output signal, $S_{out}$. The output signal being in a first state causes the current stimulus element 214 to change the current on first and/or second current leg, and the output signal being in a second state causes the current stimulus element 214 to hold the present current levels for the first and second current legs.

To provide for such selective current tuning, the current stimulus element 214 can comprise first and second digitally controlled current sources 217, 218. The first digitally controlled current source 217 delivers current to the first current leg 204, wherein this current level is set by an N+1 bit control word (C[N:0]) stored in latch 220. The second digitally controlled current source 218 delivers current to the second current leg 206, wherein this current level is set by an N+1 bit control word (C[N:0]') stored in latch 222 and latched from counter 224. In some implementations, a single N+1 bit latch (e.g., latch 222) can provide its control word to both digitally controlled current sources 217, 218, and the other latch (e.g., latch 220) may not be present.

The first and second digitally controlled current sources 217, 218 can each include N+1 unit current sources (N is a positive integer), wherein the currents from the unit current sources are summed and delivered to the appropriate current leg. In first digitally controlled current source 217, these unit current sources are labeled with reference numbers 226 and 227, which correspond to Unit current source 0 (reference number 226) through Unit current source N (reference number 227), respectively. Each unit current source can include a transmission switch, which includes a transmission gate and a PMOS transistor coupled between the output of the transmission gate and AVDCC. Each unit current source is activated based on a different bit of the control words provided to the digital current sources. For example, in first digitally controlled current source 217 having unit current source 0 (reference number 226, the least significant bit (LSB) of the control word (i.e., MB and an inverted version of this LSB (i.e., CB[0])) determine whether current is enabled from unit current source 0. If C[0] is a logical "1" and correspondingly CB[0] is a logical "0", voltage bias (VBP), which is established by diode-tied PMOS transistor 228, is passed through the transmission gate 231. This enables PMOS transistor 230, and thus provides current from unit current source 0. On the other hand, if C[0] is a logical "0" and correspondingly CB[0] is a logical "1", the transmission gate 231 is "off" and PMOS transistor 232 provides AVDDC to the gate of PMOS transistor 230, thereby disabling current from unit current source 0. The other unit current sources work in the same manner.

Table 1 below shows an example of how a calibration mode can be carried out in FIG. 2's level detector 200. This sample calibration mode is made up of thirty-two time windows, wherein the edges of each time window corresponds to edges of a low-frequency clock provided by a counter (FIG. 2, 224) as it increments. To provide some sample voltage and current levels, assume MP1 and MP2 are source followers such that the voltage level of the sources of MP1 and MP2 track their gate voltages. Thus, when VC1=100 mV is applied to the gate of MP1, MP1 has a 100 mV voltage drop between its source and drain; and when VC2=200 mV is applied to the gate of MP2, MP2 has a 200 mV voltage drop between its source and drain. Further assume that R1, R2, R3 and R4 are placed together in the physical layout of the integrated circuit, such that the process variation of R1, R2, R3, and R4 is very small, if not completely eliminated. Thus, R1 is closely matched to R3 (e.g., R1 and R3 have nearly identical resistance values), and R2 is closely matched to R4 (e.g., R2 and R4 have nearly identical resistance values). A more detailed description of functionality during the individual time windows is provided in the paragraph following Table 1.

TABLE 1

Sample calibration routine for a plurality of time windows

| Time Window | C[4:0] = C'[4:0] | I1 (A) | V1 (mV) | I2 (A) | V2 (mV) | V2 − V1 (mV) | $S_{out}$ |
|---|---|---|---|---|---|---|---|
| 1 | 10000 | 100 | 400 | 100 | 350 | −50 | 0 |
| 2 | 01111 | 92 | 376 | 92 | 338 | −38 | 0 |
| 3 | 01110 | 84 | 352 | 84 | 326 | −26 | 0 |
| 4 | 01101 | 76 | 328 | 76 | 314 | −14 | 0 |
| 5 | 01100 | 68 | 304 | 68 | 302 | −2 | 0 |
| 6 | 01001 | 60 | 280 | 60 | 290 | 10 | 1 |
| 7 | 01100 | 68 | 304 | 68 | 302 | −2 | 0 |
| 8 | 01001 | 60 | 280 | 60 | 290 | 10 | 1 |
| 9 | 01100 | 68 | 304 | 68 | 302 | −2 | 0 |
| ... | ... | ... | ... | ... | ... | ... | ... |
| 32 | 01001 | 60 | 280 | 60 | 290 | 10 | 1 |

With reference to Table 1 and FIG. 2, for the first time window when digital code 10000 is used, the first digitally controlled current source 217 delivers a first and second currents $i_1=i_2=100$ A to the first and second current legs 204, 206, respectively, which establishes voltages $V_1=400$ mV and $V_2=350$ mV. This causes the comparison element 208 to output a logical "0" for the first time window, which correspondingly causes counter 224 to decrement to digital code 01111 for the second time window. This digital code of 01111 decreases the first and second currents to $i_1=i_2=92$ A for the second time window, which correspondingly decreases $V_1$ to 376 mV and $V_2$ to 338 mV. Again, $V_2$ is less than $V_1$, so the comparison element 208 continues to output a logical "0" for the second time window. Hence, for the third time window, the counter 224 decrements to digital code 01110 and first and second currents are decreased to $i_1=i_2=84$ A. The state of the output signal $S_{out}$ remains at a logical "0" until the $6^{th}$ time window when $V_2$ exceeds $V_1$, causing the state of the output signal to flip from a logical "0" to a logical "1". This change of state causes the counter 224 to increment, so for the $7^{th}$ time window the digital control words C[N:0] and C[N:0]' revert to 01100. In this example, the digital codes of 01001 and 01100 toggle back and forth from the $7^{th}$ time window to the $32^{nd}$ time window and therefore, represent a meta-stable state where the first and second current legs are balanced. Hence, in the $32^{nd}$ time window, these calibrated current codes of 01001 are stored to be used during non-calibration mode.

After calibration is complete, the calibrated current codes remain stored in the current stimulus element 214 (or can be stored elsewhere), and switching element 210 decouples the reference voltage threshold 212 from the gates of transistors MP1, MP2 and couples the signal 216 to the gates of transistors MP1, MP2. When the signal 216, which has an unknown voltage, is applied across the gate of MP1 and the gate of MP2; the state of the output signal, $S_{out}$ signal indicates how the voltage level of the signal 216 relates to the target voltage threshold. For example, when the unknown voltage level of the signal 216 is less than the target voltage threshold, the output signal can be in a first state (e.g., $S_{out}=0$). Further, when the unknown voltage level of the signal 216 is equal to or just greater than the target voltage threshold, the output signal can transition to a second state (e.g., $S_{out}=1$). The state of $S_{out}$ reflects how the signal 216 relates to the desired voltage threshold because the calibration routine characterizes the level detector, regardless of process corners, etc. Thus, the level detector can determine, for example, whether a USB device has just been "plugged in", based on whether a 100 mV peak to peak voltage is seen on a signal encountered during real-time operation.

Figure 3:
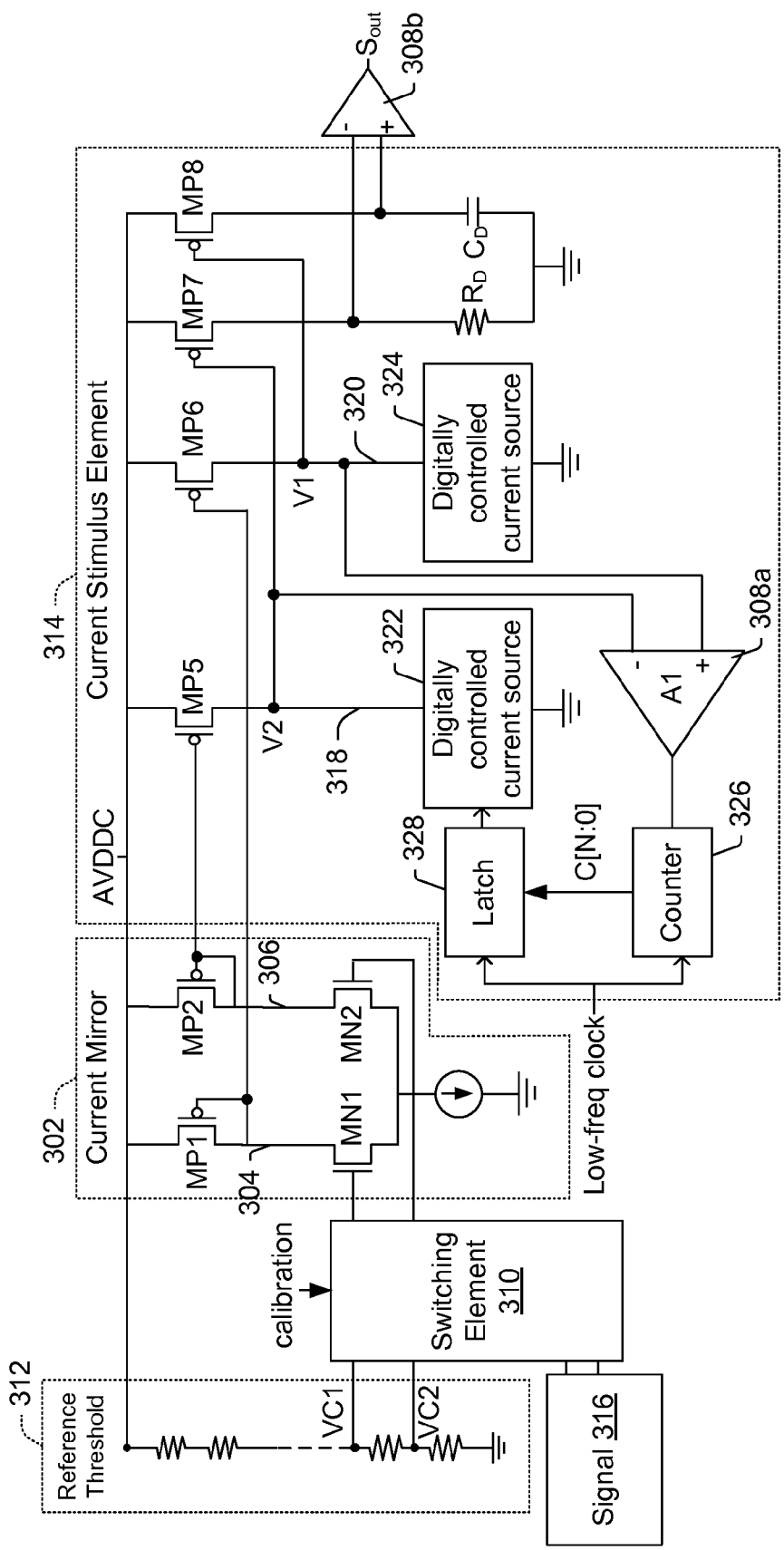
FIG. 3 shows some embodiments of a more detailed level detector circuit that makes use of improved calibration techniques.

FIG. 3 shows an embodiment of a level detector 300. The level detector 300 includes a current mirror 302 having first and second current legs 304, 306. In this example, the first current leg 304 includes a first PMOS transistor MP1 in series with a first NMOS transistor MN1; and the second current leg 306 includes a second PMOS transistor MP2 in series with a second NMOS transistor MN2. The level detector 300 also includes comparison elements 308a, 308b, switching element 310, reference voltage threshold 312, and current stimulus element 314. Current stimulus element 314 includes third and fourth current legs 318, 320 having fifth and sixth transistors MP5, MP6, respectively. Digitally controlled current sources 322, 324 can "tune" the currents through MP5 and MP6 during calibration, and correspondingly tune voltages V2 and V 1. Tuning voltages V1 and V2 alters the currents provided through MP7 and MP8 until the output signal Sout changes state at the desired voltage threshold. Resistor $R_D$ sets the voltage level for the negative (−) terminal of comparison element 308b, while capacitor $C_D$ acts as a filter to smooth out voltage spikes that can otherwise trigger false changes in output state for $S_{out}$.

During a calibration mode, level detector 300 applies the reference voltage threshold 312 to the gates of MN1 and MN2, and then, while the reference voltage threshold is applied, the current levels on the third and/or fourth current legs 318, 320 are incrementally updated by counter 326 and latch 328 until the comparison element 308a flips its output state. The current levels at which the output state has flipped are stored and subsequently used during normal operation of the device to provide a determination of how a signal 316 relates to the target voltage threshold.

Figure 4:
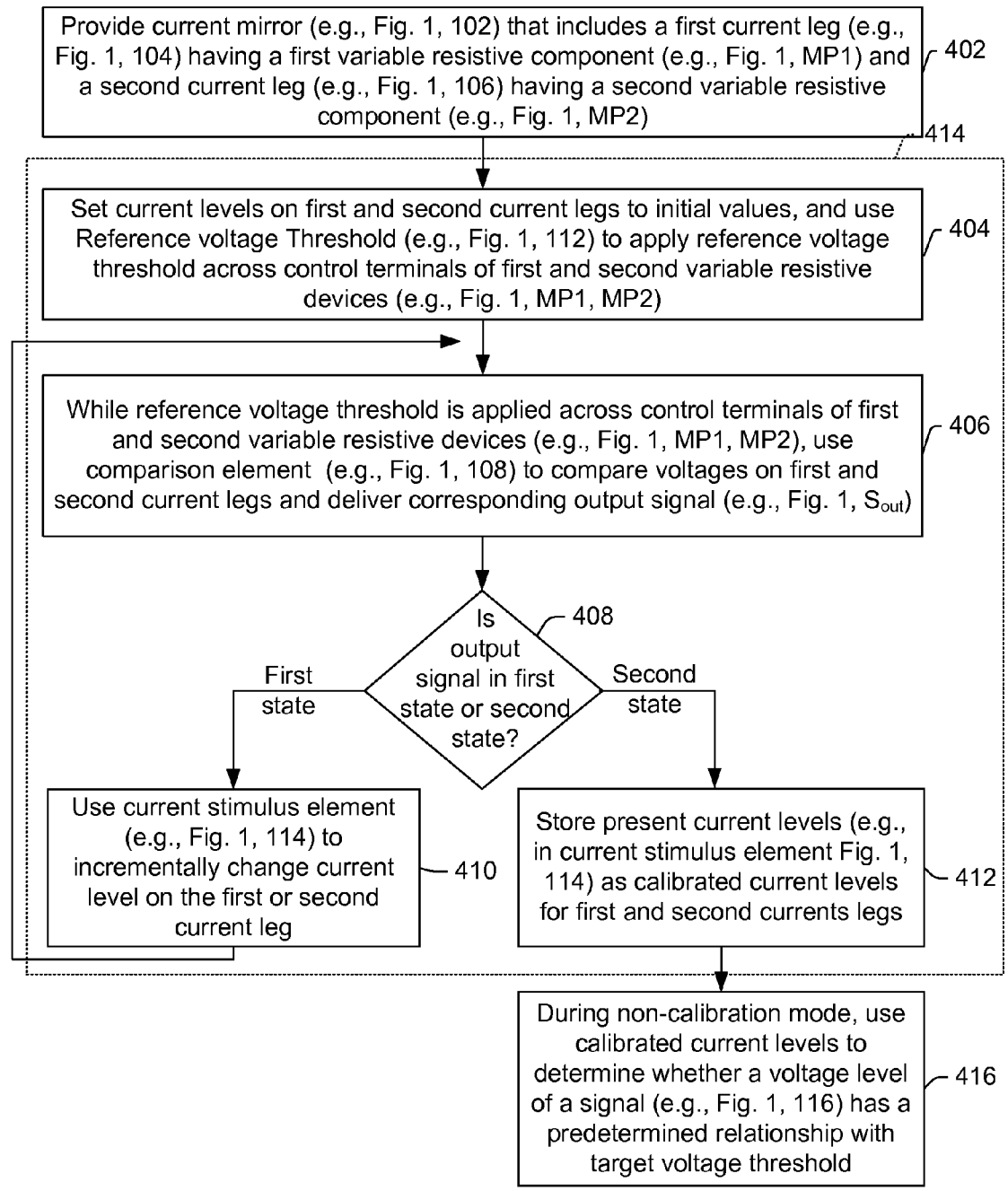
FIG. 4 shows some embodiments of a calibration method in flow chart form.

Turning now to FIG. 4, a method using voltage threshold calibration in accordance with some embodiments is disclosed. For purposes of clarity, FIG. 4 is illustrated based on FIGS. 1-3, but FIG. 4 is also applicable to other circuits, current mirrors, current legs, etc. At 402 a current mirror 102, which includes a first current leg 104 having a first variable resistor MP1 and a second current leg 106 having a second variable resistor MP2, is provided.

In 404, current levels I1, I2 on the first and second current legs 104, 106, respectively, are set to initial values, and a reference threshold voltage from reference voltage threshold 112 is applied across control terminals of the first and second variable resistors MP1.

In 406, while the reference threshold voltage is applied across the control terminals of the first and second variable resistors MP1, the method uses a comparison element 108 to compare a first voltage on the first current leg with a second voltage on the second current leg to deliver an output signal $S_{OUT}$ whose state is indicative of the comparison.

In block 410, if the output signal is in a first state (first state determination from 408), the method uses a current stimulus element 114 to incrementally change a current level on at least one of the first or second current legs 104, 106. The method then returns to 406 and re-compares the voltages on the first and second current legs. In some examples, the incremental change in the current level can be monotonically increasing along just one of the current legs while the current level of the other leg is held substantially constant.

In block 412, if the output signal is in a second state (second state determination from 408), the method stores the present current levels as calibrated current levels for first and second currents legs.

In block 416, during a non-calibration mode and after calibration 414 is complete, the calibrated current levels are used to determine whether a voltage level of a signal 116 has a predetermined relationship with a target voltage threshold. A mode signal (mode 211, FIG. 2) can change state to switch between calibration 414 and non-calibration mode 416.

Although the illustrated implementations have been depicted as described with regards to a first conductivity type that is n-type and a second conductivity type that is p-type, it will be appreciated that the first conductivity type could also be p-type and the second conductivity type can be n-type. In other words, the conductivity labels depicted in the figures and described in the text can be flipped (e.g., PMOS transistors can be made NMOS transistors, and vice versa). Further although MOS-type devices are illustrated and described, other types of transistors, such as bipolar junction transistors (BJTs), junction field effect transistors (JFETs), among others, could also be used.

Some embodiments relate to a level detector, comprising a current mirror including first and second current legs to carry first and second signals, respectively. The first current leg includes a first variable resistor and the second current leg includes a second variable resistor. During a calibration mode, a switching element provides a predetermined reference voltage across first and second control terminals of the first and second variable resistors, respectively. During a non-calibration mode, the switching element decouples the predetermined reference voltage from the first and second control terminals, and provides a signal across the first and second control terminals.

Some embodiments relate so a level detector. The level detector includes a current mirror having first and second current legs, wherein the first current leg includes a first transistor and second current leg includes a second transistor. A comparison element has first and second inputs coupled to the first and second current legs, respectively, and provides an output signal whose state is indicative of a relationship between signals on the first and second inputs. A switching element couples a reference voltage threshold, which emulates a target voltage threshold, across gates of the first and second transistors during a calibration mode. During a non-calibration mode, the switching element couples a signal to the gates of the first and second transistors. While the reference voltage threshold is applied during the calibration mode, a current stimulus element tunes current levels on at least one of the first or second current legs until the comparison element flips the state of its output signal.

It will be appreciated that identifiers such as "first" and "second" do not imply any type of ordering or placement with respect to other elements; but rather "first" and "second" and other similar identifiers are just generic identifiers. In addition, it will be appreciated that the term "electrically connected" includes direct and indirect connections. For example, if element "a" is electrically connected to element "b", element "a" can be electrically connected directly to element "b" and/or element "a" can be electrically connected to element "b" through element "c", so long as there is an operable electrical connection between elements "a" and "b".

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A level detector, comprising:
   a current mirror including first and second current legs to carry first and second signals, respectively, wherein the first current leg includes a first variable resistive component and wherein the second current leg includes a second variable resistive component; and
   a switching element adapted to provide, during a calibration mode, a non-zero predetermined reference voltage difference across first and second control terminals of the first and second variable resistive components; and further configured to, during a non-calibration mode, provide a signal across the first and second control terminals.

2. The level detector of claim 1, wherein the predetermined reference voltage difference corresponds to an expected device interface voltage level anticipated to be present when a device is connected to a device interface coupled to the first and second control terminals.

3. The level detector of claim 2, wherein the predetermined reference voltage difference is approximately 100 mV and the device interface is a universal serial bus (USB) interface.

4. The level detector of claim 2, wherein the device interface is a Peripheral Component Interconnect (PCI) interface.

5. The level detector of claim 1, wherein the first and second variable resistive component each comprise a metal-oxide semiconductor field effect transistor (MOSFET).

6. The level detector of claim 1, further comprising:
   a comparison element having first and second inputs coupled to the first and second current legs, respectively, and adapted to provide an output signal whose state is indicative of a relationship between the first and second signals.

7. The level detector of claim 6:
   wherein the predetermined reference voltage difference corresponds to an expected device interface voltage level anticipated to be present when a device is connected to a device interface coupled to the first and second control terminals; and
   wherein, during the non-calibration mode, the state of the output signal exhibits a first condition if the device is connected to the device interface, and wherein the state of the output signal exhibits a second, different condition when the device is not connected to the device interface.

8. The level detector of claim 7, further comprising:
   a current stimulus element adapted to, during a plurality of calibration time windows in the calibration mode, induce a first plurality of different current levels from a first current source to the first current leg during the plurality of calibration time windows, respectively.

9. The level detector of claim 8, wherein the current stimulus element monotonically increases a current level on the first current leg during successive calibration time windows so long as the state of the output signal is in a first state, and wherein a calibrated current level present on the first leg is stored during calibration when the state of the output signal transitions from the first state to a second state.

10. The level detector of claim 8, wherein the current stimulus element comprises a frequency counter.

11. The level detector of claim 1, wherein the reference voltage difference is provided by a reference voltage threshold circuit, the reference voltage threshold circuit comprising:
   a plurality of resistive components arranged in series along a current path between a DC supply voltage and ground voltage, wherein the predetermined reference voltage difference is established between first and second nodes on the current path.

12. A level detector, comprising:
   a current mirror having first and second current legs, wherein the first current leg includes a first transistor and second current leg includes a second transistor;
   a comparison element having first and second inputs coupled to the first and second current legs, respectively, and adapted to provide an output signal whose state is indicative of a relationship between signals on the first and second inputs;
   a switching element adapted to concurrently couple first and second reference voltages, which differ from one another and which emulate a target voltage threshold, to gates of the first and second transistors, respectively, during a calibration mode, and further adapted to couple a signal across the gates of the first and second transistors during a non-calibration mode; and
   a current stimulus element adapted to, while the first and second reference voltages are applied during the calibration mode, tune current levels on at least one of the first or second current legs until the comparison element flips the state of its output signal.

13. The level detector of claim 12, wherein the current levels present on the first and second legs when the comparison element flips the state of its output signal are stored and subsequently used during the non-calibration mode to determine whether the signal exhibits a predetermined relationship to the target voltage threshold.

14. The level detector of claim 12, wherein the current levels are tuned by continuously holding a current level on the first current leg constant throughout calibration and by monotonically increasing or decreasing a current level on the second current leg until the comparison element flips the state of its output signal.

15. The level detector of claim 12, wherein the current stimulus element comprises a frequency counter.

16. The level detector of claim 12, wherein the first and second reference voltages are provided by a reference voltage threshold circuit, the reference voltage threshold circuit comprising:
   a plurality of resistive components arranged in series along a current path between a DC supply voltage and ground voltage, wherein the first and second reference voltages are established at respective first and second nodes on the current path.

17. A calibration method for a current mirror that includes a first current leg having a first variable resistive component and a second current leg having a second variable resistive component, the method comprising:
   setting current levels on the first and second current legs to initial values, and applying a non-zero reference voltage difference across control terminals of the first and second variable resistive components;
   while the reference voltage difference is applied across the control terminals of the first and second variable resistive components, comparing a first voltage on the first current leg with a second voltage on the second current leg to deliver an output signal whose state is indicative of the comparison;

if the output signal is in a first state, changing a current level on at least one of the first or second current legs and updating the state of the output signal for the changed current level; and if the output signal is in a second state, storing the present current levels as calibrated current levels for first and second currents legs.

18. The method of claim 17, further comprising:

during a non-calibration mode, using the calibrated current levels to determine whether a voltage level of a signal has a predetermined relationship with a voltage threshold.

19. The method of claim 18, wherein if the output signal is in the first state, the current level on at least one of the first or second current legs is increased by a predetermined amount.

20. The method of claim 18, wherein the current level on at least one of the first or second current legs is increased iteratively by a predetermined amount for successive iterations until the output signal transitions to the second state, and wherein the current levels when the output signal transitions to the second state are considered the calibrated current levels.

* * * * *